(12) United States Patent
Degrenne et al.

(10) Patent No.: US 11,474,146 B2
(45) Date of Patent: Oct. 18, 2022

(54) METHOD FOR ESTIMATING DEGRADATION OF A WIRE-BONDED POWER SEMI-CONDUCTOR MODULE

(71) Applicant: MITSUBISHI ELECTRIC CORPORATION, Tokyo (JP)

(72) Inventors: Nicolas Degrenne, Rennes (FR); Guilherme Bueno Mariani, Rennes (FR)

(73) Assignee: Mitsubishi Electric Corporation, Tokyo (JP)

( * ) Notice: Subject to any disclaimer, the term of this patent is extended or adjusted under 35 U.S.C. 154(b) by 150 days.

(21) Appl. No.: 16/962,130

(22) PCT Filed: Jan. 29, 2019

(86) PCT No.: PCT/JP2019/003764
§ 371 (c)(1),
(2) Date: Jul. 14, 2020

(87) PCT Pub. No.: WO2019/167548
PCT Pub. Date: Sep. 6, 2019

(65) Prior Publication Data
US 2020/0408830 A1 Dec. 31, 2020

(30) Foreign Application Priority Data
Feb. 27, 2018 (EP) .................... 18305210

(51) Int. Cl.
*G01R 31/28* (2006.01)
*G01R 31/70* (2020.01)
(52) U.S. Cl.
CPC ..... *G01R 31/2817* (2013.01); *G01R 31/2812* (2013.01); *G01R 31/2818* (2013.01); *G01R 31/2874* (2013.01); *G01R 31/70* (2020.01)

(58) Field of Classification Search
CPC .................. H01L 24/05; H01L 24/49; H01L 2224/85203; H01L 22/14; H01L 2224/789;
(Continued)

(56) References Cited

U.S. PATENT DOCUMENTS 5,323,952 A * 6/1994 Kato ...................... B23K 20/10
228/102
6,993,446 B2 * 1/2006 Gunawardana .... G01R 31/2858
702/33

(Continued)

FOREIGN PATENT DOCUMENTS
JP 2017-17822 A 1/2017

OTHER PUBLICATIONS

Alghassi et al., "Stochastic RUL Calculation Enhanced With TDNN-Based IGBT Failure Modeling", IEEE Transactions on Reliability, vol. 65, No. 2, Jun. 2016, pp. 558-573.
(Continued)

*Primary Examiner* — Vinh P Nguyen
(74) *Attorney, Agent, or Firm* — Birch, Stewart, Kolasch & Birch, LLP (57) ABSTRACT

A method for estimating degradation of a wire-bonded power semi-conductor module is provided. The method includes obtaining an indicator of degradation ($Degr_{est\_t-1}$); estimating an estimated indicator of degradation ($Degr_{est\_t}$) by a temporal degradation model; obtaining a set of on-line measure ($X_{on\_meas\_t}$); then, (1) converting the on-line measure ($X_{on\_meas\_t}$) into a deducted indicator of degradation ($Degr_{meas\_t}$) by an electrical equivalence model, and (2) computing a deviation between estimated and deducted indicator of degradation ($Degr_{est\_t}$; $Degr_{meas\_t}$); and/or (1) converting the estimated indicator of degradation ($Degr_{est\_t}$) into a set of on-line estimation ($X_{on\_est\_t}$), and (2) computing
(Continued)

a deviation between set of on-line measure and estimation ($X_{on\_meas\_t}$; $X_{on\_est\_t}$); and correcting the estimated indicator of degradation ($Degr_{est\_t}$) into a corrected estimated indicator of degradation ($Degr_{corr\_t}$) as a function of the computed deviation.

7 Claims, 3 Drawing Sheets

(58) Field of Classification Search
CPC ............. H01L 23/4952; H01L 2224/45; H01L 2224/48105; H01L 23/49811; H01L 24/16; H01L 23/48; H01L 27/0248; H01L 23/34; H01L 27/3276; H01L 2933/0066; H01L 24/02; H01L 41/047; H01L 2924/3512; G01R 31/70; G01R 31/2884; G01R 31/52; G01R 31/2853; G01R 31/2642; G01R 31/26; G01R 31/2812; G01R 31/2874; G01R 31/2879; G01R 31/66; G01R 31/54; G01R 27/08; G01R 31/007; G01R 31/2813; G01R 31/00; G01R 31/2875; G01R 31/71; G01R 31/2817; G01R 31/2818; G01R 31/3646; G01R 31/58; G01R 31/3275
See application file for complete search history.

(56) References Cited

U.S. PATENT DOCUMENTS

| | | | | |
|---|---|---|---|---|
| 9,354,269 | B2* | 5/2016 | Miyazawa | G01R 31/52 |
| 9,733,302 | B2* | 8/2017 | Zhang | G01R 31/2879 |
| 10,222,412 | B2* | 3/2019 | Kang | G01R 31/2874 |
| 10,288,672 | B2* | 5/2019 | Qiao | G01R 31/2642 |
| 10,705,133 | B2* | 7/2020 | Degrenne | G01R 31/2619 |
| 11,169,201 | B2* | 11/2021 | Degrenne | G01R 31/2608 |
| 2004/0182573 | A1 | 9/2004 | Gunawardana et al. | |
| 2017/0003337 | A1 | 1/2017 | Bito et al. | |
| 2017/0169313 | A1 | 6/2017 | Choi et al. | |
| 2018/0017613 | A1 | 1/2018 | Qiao et al. | |

OTHER PUBLICATIONS

Dusmez et al., "Remaining Useful Lifetime Estimation for Thermally Stressed Power MOSFETs Based on ON-State Resistance Variation", IEEE Transactions on Industry Applications, vol. 52, No. 3, May/Jun. 2016, pp. 2554-2563.

Eleffendi et al., "In-Service Diag11ostics for Wire-Bond Lift-off and Solder Fatigue of Power Semiconductor Packages", IEEE Transactions on Power Electronics, vol. 32, No. 9, Sep. 2017, pp. 7187-7198.

Eleffendi et al., Evaluation of On-state Voltage $V_{CE(ON)}$ and Threshold Voltage $V_{th}$ for Real-time Health Monitoring of IGBT Power Modules, 2015 17th European Conference on Power and Electronics and Applications (EPE '15 ECCE-Europe), Jointly owned by EPE Association and IEEE PELS, Sep. 8, 2015, pp 1-10.

Haque et al., "Auxiliary Particle Filtering-Based Estimation of Remaining Useful Life of IGBT", IEEE Transactions on Industrial Electronics, vol. 65, No. 3, Mar. 2018, pp. 2693-2703.

Japanese Office Action for Japanese Application No. 2020-526649, dated Jun. 8, 2021, with English translation.

* cited by examiner

METHOD FOR ESTIMATING DEGRADATION OF A WIRE-BONDED POWER SEMI-CONDUCTOR MODULE

TECHNICAL FIELD

The invention pertains to the technical field of power semiconductor devices. More specifically, the invention is related to the monitoring of such devices.

BACKGROUND ART

Usually, in a power semiconductor device, one or several power semiconductor dies are mechanically, thermally, and electrically attached to a substrate. The bottom-side of the die is typically soldered or sintered to the substrate. The top-side is typically connected to bond wires.

Such devices are submitted to high thermic changes and high thermo-mechanical stresses. Due to the wide variety in the compositions and structures of the different parts constituting the devices, crack propagation, wire-bonds lift-off, delamination, metallization reconstruction and other effects lead to failure of the interconnections. Such failures are very difficult to predict or to detect before the general breakdown of the device.

Recently, some of semi-conductor devices are provided with sensors enabling to monitor some on-line properties, which means during the operational life of the devices. But the variations in the measured properties are generally due to both degradation of the devices and normal variations during the operation of the devices. As a consequence, monitoring such properties is not sufficient to directly deduce a degradation state of the device.

The invention improves the situation.

SUMMARY OF INVENTION

It is proposed a method for estimating degradation of a wire-bonded power semi-conductor module comprising:
  a) obtaining an indicator of degradation of said module at a first instant;
  b) estimating an estimated indicator of degradation of said module at a second instant by applying a temporal degradation model to said indicator of degradation at said first instant;
  c) obtaining a set of on-line measure, said set including at least one of an on-state measured voltage, an on-state measured current and an on-line measured temperature of said module and each being measured at said second instant within plus or minus 100 microseconds; then,
  d1) converting said set of on-line measure into a deducted indicator of degradation at said second instant by applying an electrical equivalence model, and
    e1) computing a deviation between said estimated indicator of degradation and said deducted indicator of degradation; and/or
  d2) converting said estimated indicator of degradation at said second instant into a set of on-line estimation, said set including at least one of an on-state estimated voltage, an on-state estimated current and an on-line estimated temperature of said module and each being estimated for said second instant by applying an electrical equivalence model, and
    e2) computing a deviation between said set of on-line measure and said set of on-line estimation; and
  f) correcting said estimated indicator of degradation at said second instant into a corrected estimated indicator of degradation at said second instant in function of the computed deviation.

Such a method enables to deduce a more accurate indicator of the degradation of a semi-conductor module with a limited number and quality of sensors. The indicator is updated without need to interrupt the normal operation of the module. The accuracy is increased during time by distinguishing the parts of the variations in the measured properties which are due to local or temporal situations and the parts of the variations in the measured properties which are really due to irreversible degradations of the module.

In another aspect, it is proposed a system comprising:
  at least one wire-bonded power semi-conductor module,
  a set of sensor coupled to the said at least one module such that to measure a set of on-line measure, said set including at least one of an on-state measured voltage, an on-state measured current and an on-line measured temperature of said at least one module, and
  a processor operatively associated to a memory and arranged to received data issued from the measures of the set of sensor and to execute a method according to one of the preceding claims.

In another aspect, the applicant proposes a computer software comprising instructions to implement a method as defined here when the software is executed by a processor. In another aspect, the applicant proposes a computer-readable non-transient recording medium on which a software is registered to implement the method as defined here when the software is executed by a processor.

The device and/or the method can optionally comprise the following features, separately or in combination one with the others:
  The series of steps a) to f) are repeatedly executed as iterative loops. The corrected estimated indicator of degradation obtained at the end of a previous series is used as the indicator of degradation at a first instant for the next series. This enables to monitor the module in real time while enhancing the accuracy of the estimations from one series to the next one.
  The degradation model includes a parameter. The value of said parameter is updated in function of the deviation computed in the previous series. This enables to update the used models from one series to the next one.
  At least a temperature value and a current value are monitored. Step c) is triggered when the monitored values respect predetermined criteria. This enables to have simplified models by suppressing the temperature and the current from the variables parameters.
  The series of steps a) to f) are executed at least a first time during a monitoring phase, and then, at least one series of the following steps is executed, during a forecast phase:
    a') obtaining an indicator of degradation of said module at a first instant;
    b') estimating an estimated indicator of degradation of said module at a second instant by applying a temporal degradation model to said indicator of degradation at said first instant.

This enables both monitoring present degradation (in real-time for example) and estimating future degradation in function of simulated future measures.

Other features, details and advantages will be shown in the following detailed description and on the figures.

DESCRIPTION OF EMBODIMENTS

Figures and the following detailed description contain, essentially, some exact elements. They can be used to enhance understanding the invention and, also, to define the invention if necessary.

Figure 1:
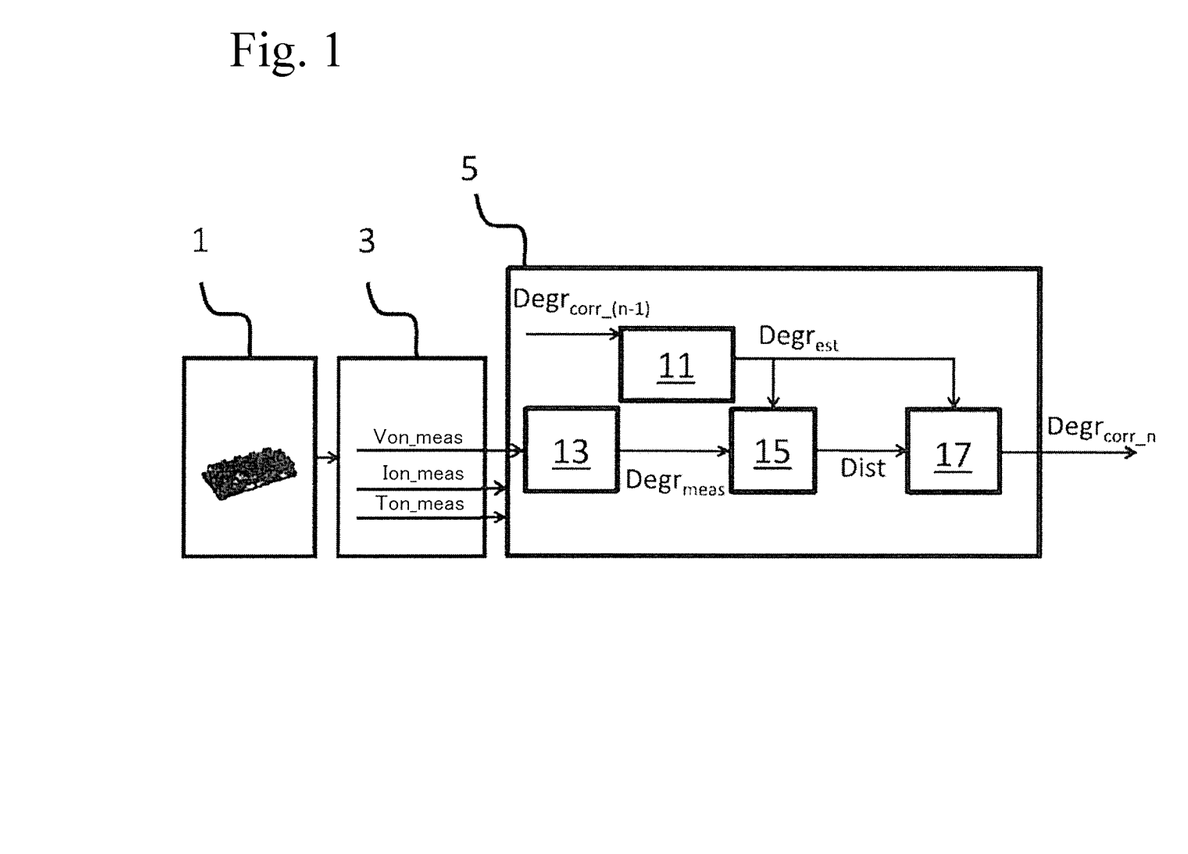
FIG. 1 is a schematic representation of the treatment applied to the data according to an embodiment of the invention.
Figure 2:
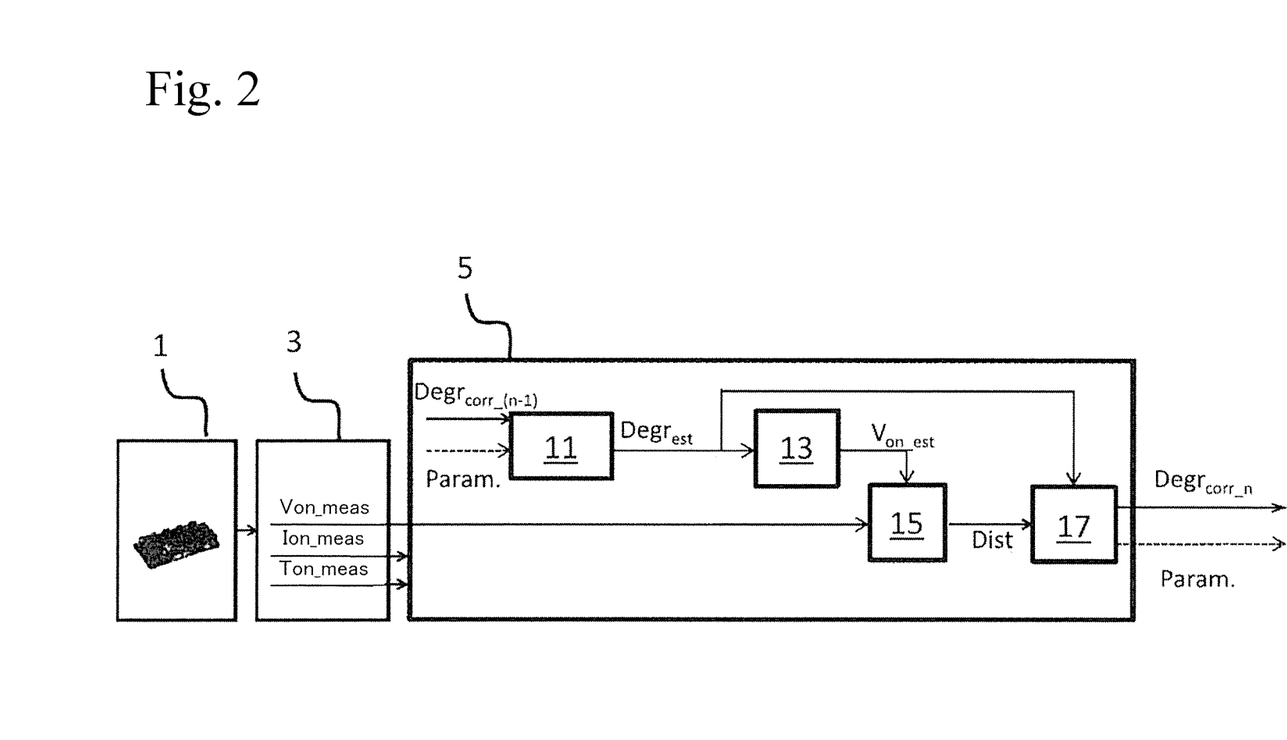
FIG. 2 is a schematic representation of the treatment applied to the data according to an embodiment of the invention.

FIGS. 1 and 2 each show a wire-bonded power semi-conductor module 1. Such a module 1 comprises, for example, an Insulated Gate Bipolar Transistor (IGBT), a MetalOxideSemiconductor Field-Effect Transistor (MOSFET) and/or diode assembly. It comprises at least one semiconductor die as a power semiconductor: it is arranged to operate under a voltage superior to 50V and a current superior to 1 A. The module 1 comprises conductive wire bonds ensuring electrical connection between distinct metallization parts of the module 1. As it is known, the electrical connections between the wire bonds and the metallization are submitted to hard conditions during the operational life of the module 1. Some of any deficiencies of the module 1 during its operating life are due to degradation of such connections.

A set of sensors 3 is provided coupled to the module 1. On figures, the sensors 3 are shown as a distinct part from the module 1 to enhance understanding. In some embodiments, at least one of the sensors 3 is embedded into the module 1.

The set of sensors 3 are arranged to obtain a set of on-line measure(s). In the following, the general reference $X_{on\_meas\_t}$ is used to designate such a measure. The index "t" means that the measures are made at the instant t. The letter "X" is used to be general, without precising the natures of the measures. The index "on" means "on-line" and have to be understood, here, as a measure made during the operational life of the module 1. In other words, the measure is not made during a test phase of the module, on a test bench, with laboratory conditions. On the contrary, the measures are made in its normal environment, when submitted to real conditions, for example in a train machine in movement. Some of these measures are, in addition, made "on-state", which means that when the components are in an active phase. For example, a voltage V and a current I are measured when the corresponding components are submitted to a non-zero current. On the contrary, due to the thermal inertia, the temperature is measured "on-line" but can be measure "on-state" or "off-state". The set of sensors 3 are arranged to acquire relevant data during the normal operation of the module. 1. The index "meas" means that the information is obtained from a physical measurement by a sensor.

In the following examples, the set of on-line measures contains a plurality of measures. In some embodiments, the set of on-line measures contains a single measure for each instant t, even if the plural "measures" is used.

When the set of on-line measures contains a plurality of measures, each measure of the set are made substantially at the same instant t. In the context of power semi-conductor devices, "substantially" the same instant means within a sufficiently small time frame compared to the thermal and electrical time constants of the system including the module 1. The same instant means, for example, within plus or minus 100 microseconds. In some embodiments, a set of measures is extracted repeatedly, for example one time by a day.

In the following examples, the set of on-line measures $X_{on\_meas\_t}$ includes at least one of:
- an on-state measured voltage $V_{on\_meas\_t}$ of the module 1;
- an on-state measured current $I_{on\_meas\_t}$ of the module 1;
- an on-line measured temperature $T_{on\_meas\_t}$, of the module 1.

In the following, the set of sensors 3 is associated to a single module 1 comprising a single semi-conductor element (for example IGBT, MOSFET or diode assembly). In various embodiments, a set of sensors can be associated to a plurality of semi-conductor elements of a single module or of a plurality of modules 1.

To measure the on-line measured voltage $V_{on\_meas\_t}$ across the semi-conductor element of a module 1, the set of sensors 3 can comprise a voltage sensor. The voltage sensor can comprises:
- a protection circuit that protects the other parts of the sensor from high voltages present across the module 1, including in the off-state;
- an analog-to-digital converter (ADC) arranged to digitalize the voltage;
- optionally, an isolator, especially in cases where the sensed voltage is at a different potential from thus of the processing circuit. One voltage sensor may be used for two semi-conductor elements in parallel. The distinction is then performed knowing the current value and/or the gate level of one element.

$V_{on\_meas}$ may also be an estimation of the voltage drop across the connection only. If a Kelvin connection is available, the voltage drop observed between the Kelvin Emitter and the power Emitter enables to obtain the on-state voltage $V_{on\_meas}$ across the connection only.

To measure the on-line measured temperature $T_{on\_meas\_t}$, of an active part of a semi-conductor element of a module 1, the set of sensors 3 can comprises a temperature sensor. For example, the active part from which the temperature is acquired can be a junction (a part of a chip itself of the module 1), the measured temperature being referenced $T_j$, or an electrical connection (of a wire), the measured temperature being referenced $T_{Con}$. The temperature sensor can comprise:
- a sensor embedded on the semiconductor element, for example a chip; and/or
- a sensor based on a temperature sensitive electrical parameter (TSEP).

The on-line measured temperature $T_{on\_meas\_t}$ can also results from estimation based on a thermal model, for example when the thermal sensor is not immediately disposed at proximity of the semi-conductor element. The temperature can be estimated using both a thermal model and a sensor. Thus, the accuracy/precision is improved. Typical inputs for a thermal model are an estimation of the power losses in the semi-conductor $P_{loss}$ and a temperature value, for example the case temperature or the ambient temperature. In this case, the value $T_{on\_meas}$ may be the case temperature. The temperature value used in the following can be corrected in view of the other values like $I_{on}$ and $V_{on}$. The input of the power loss model can be $I_{on}$ and $V_{on\_meas}$ or $V_{on\_corr}$. In such a case, $V_{on\_corr}$ is a filtered value of $V_{on\_meas}$.

To measure the on-state measured current $I_{on\_meas\_t}$ across the semi-conductor element of a module 1, the set of sensors 3 can comprises a current sensor. For example, the current sensor measures the collector current $I_c$ in case of an IGBT, the drain current $I_d$ in case of a MOSFET, and/or the anode current $I_a$ in case of a diode assembly. The current sensor can comprise, for example:

current mirrors;

Hall-effect sensors;

Shunt resistors;

Current estimators in function of input control signals.

In the following examples, the set of on-line measures $X_{on\_meas\_t}$ comprises the triple of an on-state measured voltage $V_{on\_meas\_t}$, an on-state measured current $I_{on\_meas\_t}$, and an on-line measured temperature $T_{on\_meas\_t}$. The triple is acquired with a fixed sample frequency, for example at each switching frequency, or each modulation frequency. Alternatively, the triple is acquired upon request from the apparatus 5 described hereinafter.

Figure 3:
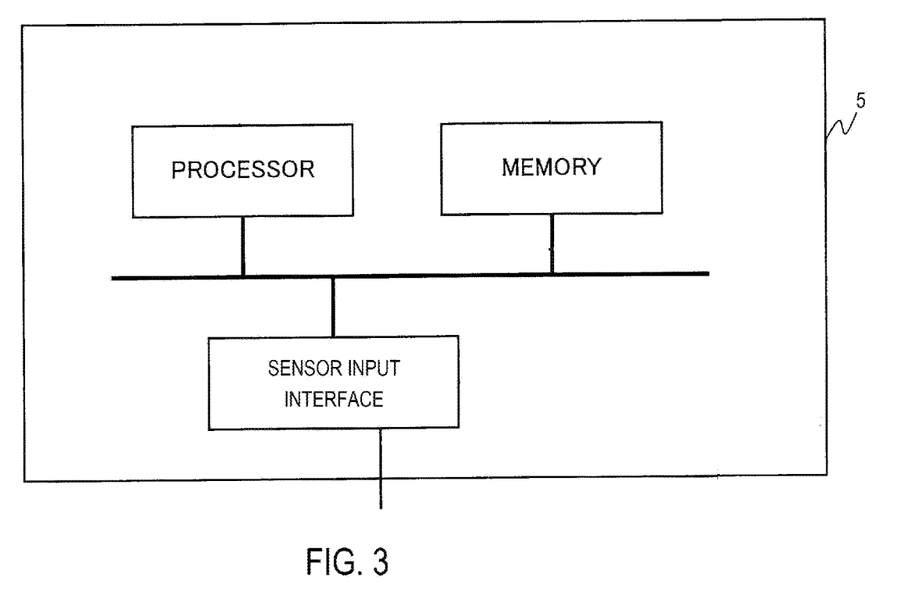
FIG. 3 is a schematic representation of a system according to an embodiment of the invention.

The apparatus 5 comprises at least a processor operatively associated to a memory and arranged to receive input data issued from the set of sensors 3. In other words, at least some of the measures described above form input data for the apparatus 5. The apparatus and its processor are arranged to execute a method to provide, as output data, at least one corrected indicator of degradation $Degr_{corr\_t}$ of the module 1 in function of the input data.

The apparatus 5 is connected to the output of the set of sensors 3. Physically, the apparatus 5 can be embedded into the module 1 itself, form a distinct device or be distant from the module 1 and/or the set of sensors 3. For example, the apparatus 5 can form a server connected to the set of sensors 3 via a network. In such a case, each apparatus 5 can receive input data issued from a plurality of modules 1. This enables, for example, to ensure monitoring of a large fleet of modules 1.

The method for estimating degradation of such a module 1 will now be described. In some embodiments, the method comprises a series of steps (referenced a) to f) in the following). The series is repeatedly executed as iterative loops. Each loop is relative to an instant t. The next iterative corresponds to a posterior instant t+1. Thus, at least some of the output data of an iterative loop can be both:

an output of the method and of the apparatus 5; and an input of the next iterative loop of the method.

For example, the corrected indicator of degradation $Degr_{corr\_t-1}$ obtained at the end of a loop corresponding to instant t−1 is used as an indicator of degradation $Degr_{est\_t-1}$ in the next loop corresponding to instant t.

A series of steps of the method comprises the step a) of obtaining an indicator of degradation $Degr_{est\_t-1}$ of the module 1 at a first instant t−1. In an initial implementation of the method, for a first series of steps, the value of the indicator of degradation $Degr_{est\_t-1}$ can be arbitrarily fixed, for example deduced from measures and/or estimations made at the beginning operational life of the module 1.

Here and in the following, the indicator, of degradation $Degr_{est}$ can be of various types. In some embodiments, the comparison of the value of a $Degr_{est}$ with respect to another one is more important than the value by itself. For example, monitoring the temporal evolution of the $Degr_{est}$ of a module 1 is more important and physically relevant than its intrinsic value. For example, comparing each $Degr_{est}$ of a plurality of analogous modules 1 enables to detect modules subjected to an abnormal deterioration.

As non-limiting examples, the indicator of degradation $Degr_{est}$ can have the form of an electrical resistance $\Delta R$ (in Ohms) of the module 1;

a state of health (in percent between 100% for a module 1 without degradation at all and 0% for a module 1 out of order);

a time before breakdown (in hours, days, number of cycles).

As it can be easily understood, a person skilled in the art could use any equivalent form for the index $Degr_{est}$. For example, the index $Degr_{est}$ can corresponds to a crack-length in wire-bonds, a resistivity of a metallization or and number of wire-bond lifted-off.

A series of steps of the method comprises the step b) of estimating an estimated indicator of degradation $Degr_{est\_t}$ of the module 1 at a second instant t by applying a temporal degradation model 11 to the indicator of degradation $Degr_{est\_t-1}$ at the first instant t−1. In other words, the degradation model 11 enables to estimate the degradation indicator at iteration n knowing at least the degradation indicator at iteration n−1. Some of non-limiting examples of form of degradation models are given hereinafter.

EXAMPLE 1

$$Degr_{est\_n}=Degr_{corr\_n-1}$$

EXAMPLE 2

$$\begin{bmatrix} Degr_{est\_n} \\ \dot{Degr}_{est\_n} \end{bmatrix} = \begin{bmatrix} a & b \\ c & d \end{bmatrix} \cdot \begin{bmatrix} Degr_{corr\_n-1} \\ \dot{Degr}_{corr\_n-1} \end{bmatrix}$$

where a, b, c and d are functions of and T.

EXAMPLE 3

$$Degr_{est\_n}=Degr_{corr\_n-1} f(I_{on}, T)$$

EXAMPLE 4

$$Degr_{est\_n}=Degr_{corr\_n-1}+f(\Delta T)$$

EXAMPLE 5 (EMPERICAL MODEL)

$$Degr_{est\_n}=Degr_{corr\_n-1} \cdot \exp(a \cdot \Delta D)$$

$$\Delta D = g(\Delta T)$$

Where $\Delta D$ is the damage computed between the iterations n−1 and n. The calculation of $\Delta D$ may be based on the number of temperature cycles $\Delta T$ counted by a counting algorithm such as the Rainflow algorithm, weighted by a damage law such as Coffin Manson law, and accumulated by a damage accumulation law such as a linear accumulation law. a is a parameter that can be pre-defined or corrected as well as the resistance increase $\Delta R$ (in embodiments where Degr is equivalent to $\Delta R$).

Alternatively, the model may be based on physics. For example, the temperature cycles are used to estimate a plastic and/or elastic fatigue energy in the geometry of the power semi-conductor element, and this energy is used to estimate a crack propagation rate. The crack length can be used as the degradation indicator $Degr_{est}$.

The method comprises the step c) of obtaining a set of on-line measures $X_{on\_meas\_t}$. In other words, the data issued from the measures made by the set of sensors 3 are used as an input data in the series.

Chronologically, the step b) follows the step a) because the indicator obtained in step a) is used to execute the step b). The step c) can be executed independently from steps a)

and b). As a consequence, the step c) can be executed before, after or at the same time as steps a)-b) when the method is executed.

After steps a), b) and c), a series of steps of the method comprises steps d1)-e1), or d2)-e2), or both of them.

The step d1) includes converting the set of on-line measure $X_{on\_meas\_t}$ (issued from the step c)) into a deducted indicator of degradation ($Degr_{meas\_t}$) at the instant t by applying an electrical equivalence model 13. The electrical equivalence model 13 will be described hereinafter.

Then, the step e1) includes computing a deviation 15 (or distance) between the estimated indicator of degradation $Degr_{est\_t}$ (issued from step b)) and the deducted indicator of degradation $Degr_{meas\_t}$ (issued from step d1)). In such a context, the deviation can be a mathematical difference (a simple subtraction) or a square root difference, or the likelihood according to a probabilistic distribution. For example, the deviation is as follows:

$$Dist_t = \sqrt{Degr^2_{meas\_t} - Degr^2_{est\_t}}$$

The step d2) includes converting the estimated indicator of degradation $Degr_{est\_t}$ at the instant t into a set of on-line estimation $X_{on\_est\_t}$. The set of on-line estimation $X_{on\_est\_t}$ includes at least one of an on-state estimated voltage $V_{on\_est\_t}$, an on-state estimated current $I_{on\_est\_t}$ and an on-line estimated temperature $T_{on\_est\_t}$ of said module 1, each being estimated for, the instant t by applying an electrical equivalence model 13. Preferably, the set of on-line estimation $X_{on\_est\_t}$ includes the same type of parameters as the parameters obtained at the step c) (measurements).

Then, the step e2) includes computing a deviation 15 (or distance) between the set of on-line measure $X_{on\_meas\_t}$ (issued from step c)) and the set of on-line estimation $X_{on\_est\_t}$ (issued from step d2)). In such a context, the deviation can be a mathematical difference (a simple subtraction) or a square root difference, or the likelihood according to a probabilistic distribution. If a plurality of type of parameters is available, the deviation is calculated type by type. For example, the deviation is as follows:

$$Dist_t = \sqrt{X^2_{on\_meas\_t} - X^2_{on\_est\_t}}$$

An electrical model 13 is arranged to estimate $X_{on\_est}$ in function of at least the indicator of degradation $Degr_{est}$ and/or to estimate $Degr_{est}$ in function of the measured value $Degr_{meas}$. Some of non-limiting examples of electrical models 13 are given hereinafter. In said examples, it is considered that $X_{on\_est} = V_{on\_est}$. Alternatively, other types of parameters can be used.

EXAMPLE A

In a first example shown on FIG. 1, wherein the execution of steps d1)-e1) are implemented (not steps d2)-e2)). The electrical model 13 uses $V_{on\_meas}$ to deduce the indicator of degradation $Degr_{meas}$.

EXAMPLE B

In a second example shown on FIG. 2, wherein the execution of steps d2)-e2) are implemented (not steps d1)-e1)). The electrical model uses $Degr_{est}$ to deduce $V_{on\_est}$. For example, in the case where Degr is equivalent to $\Delta R$ and where I and T are available as inputs, the electrical model can be (I and T may be directly respectively $I_{on\_meas}$ and $T_{meas}$, or may be values derived from these measures):

$$V_{on\_est} = f(T, I, D_{egr\_est})$$

$$V_{on\_est} = V_{elem}(T,I) + (R_{connec,init}(T) + \Delta R) \cdot I$$

$V_{elem}(T,I)$ can be a function defined in a look-up table stored in the memory of the apparatus 5, or can be a model such as:

$$V_{elem}(T,I) = \ln(a \cdot I + b) \cdot (c \cdot T + d)$$

where the parameters a, b, c and d are either:
- pre-defined and based on standard values for this type of semi-conductor element;
- pre-defined and based on a specific calibration at the end of the manufacturing process of the semi-conductor element; or
- pre-defined and based on an on-line calibration at the beginning of the operation (for example $\Delta R = 0$).

$R_{connec,init}(T)$ can be a value deduced from a temperature measure as above described. It can correspond to a resistance of a connection deduced from a temperature connection $T_C$ at the beginning of life of the module 1.

In such an example, the initial Degr value is either a constant predefined value (for example Degr=0) or equal to the Degr value obtained at the previous instant (previous loop)

In alternative embodiments, the method (or at least series of steps a)-f)) is triggered when the values I and T are equal to predetermined values. Thus, there is no need to include I or T as parameters in the electrical model 13:

$$V_{on,est} = f(Degr_{est})$$

In such embodiments, the method further include a step of moment detection that will consider T and I, and trigger the degradation estimation when T and I respond to precise criteria, for example I=100 A±1% and T=100° C.±1%.

A series of steps of the method comprises the step f) of correcting 17 the estimated indicator of degradation $Degr_{est\_t}$ (issued from step b)) into a corrected indicator of degradation $Degr_{corr\_t}$ in function of the computed deviation (issued from steps e1) and/or e2)).

EXAMPLE i (LOWEST ERROR OF A POPULATION, AND PARTICLE FILTER)

One basic example is to assume only a certain population of values of degradation indicator Degr. For example, the values are filtered to keep only the degradation indicators for which $Degr_{est}$ is substantially equivalent to $Degr_{meas}$. In other words, the extreme values can be filtered (ignored in the following).

Then, a general deviation is deduced from the filtered population for the entire population. The general deviation, like for the previous specific deviation, can be a difference, a square root difference or the likelihood according to a probabilistic distribution. In various embodiments, the state $\Delta R$ corresponding to the lowest error can be selected (the corrector is thus a selector). Alternatively, a selection of the most likely states is selected and represents a population with a probabilistic distribution (for example a Gaussian repartition).

The general deviation can be called an "error" between the estimated degradation and the measured degradation.

The estimated indicator of degradation $Degr_{est\_t}$ is corrected into the indicator of degradation $Degr_{corr\_t}$ by subtracting the said error.

EXAMPLE ii (FILTER KALMAN)

In some embodiments, the method uses a filter such as a Kalman filter or derivations of the Kalman filters (non-linear or extended for example), for example in step f).

The degradation indicator (for example value of $\Delta R$) is computed with a filter/observer/corrector. At each new degradation estimation of an instant t, the degradation model estimates the degradation level $Degr_{est\_t}$. It is compared to the measured value $Degr_{meas\_t}$, and corrected.

In some embodiments, the degradation model 11 estimates both the degradation $Degr_{est}$ and the covariance $Cov_{est}$ based on the degradation model 11 noise. The electrical model 13 estimates both $X_{on\_est}$ ($V_{on\_est}$ for example) and the associated covariance based on the measurement noise. The corrector uses the Kalman gain, computed based on both the previously estimated covariance to update (correct) the degradation $Degr_{corr}$ and the degradation model covariance.

EXAMPLE iii (CORRECTING THE MODELS)

The correction may be directly only on the degradation indicator Degr, but may also be directed on the degradation model parameters. Thus the model is auto-learning and the method comprises a machine learning aspect.

In the example case of FIG. 2, the parameters of the degradation model 11 are further corrected from one series to the next one in function to the computed error. This option is represented by dotted line arrows. Such a method enables to compute (update) the degradation model.

All the models 11, 13 used by the method may incorporate uncertainties. For example, the electrical model 13 may provide an estimation $V_{on\_est}$ ($\sigma$), $\sigma$ being an uncertainty metric. For example, a is the standard deviation of a probabilistic distribution.

The various estimates (preferably at least $V_{on\_est}$) and states (preferably at least $\Delta R$) generated by the method can further be processed for generating supplementary information, for example:
State of health (in %, for example from 100% to 0%);
End of life estimate (a date);
Remaining Useful Life (RUL) estimate (in time or number of cycles);
Type of damage (crack propagation, desoldering, delamination, etc.);
Location of the damage.

Some of these types of information can be provided to other methods/apparatus as input data. For example, health management programs can adapt the stress and the distribution of workload between some semi-conductor modules in function of this information.

In various embodiments, the method comprises further processing that may include comparison to a threshold value, extrapolation, curve fitting and/or particle propagation.

In one alternative mode of implementation, at least the current and ambient temperature are extrapolated based on the past history of current values (mission profile). The method is run partially with the extrapolated current and ambient temperature to estimate the evolution of the damage parameters in the future. The on-line measurement functions allow the corrections of estimates and models are deactivated in this phase. In other words, the method has been previously described in a context of a monitoring phase, in a present time, for example in real-time. The method can also be implemented in a context of a forecast phase, for a future time. In such a case, any "measurements" is impossible and the values $X_{on\_meas\_t}$ cannot be physically acquired for a future instant. Nevertheless, estimating an estimated indicator of degradation for future instants t' and t'+1 is possible in function of indicator of degradation of present instants t and t+1.

The method of the invention enables to obtain an indicator of degradation which can have a physical meaning, and which is thus more easily verified (by observations) and extrapolated. The indicator of degradation can be constructed to be insensitive to temperature and current, and to be only sensitive to degradation. It combines data acquisition and predefined models, taking advantage of both data-driven and model-based approaches. Data filtering can easily be added to the method to reduce the noise present in the on-line measure of $V_{on}$. The models can be updated, enabling auto-learning.

When the method/apparatus 5 is common for a plurality of modules 1, for example when the set of measures are sent to an external server to be treated, the updated models parameters and/or the structures of the models can be used for a plurality of modules 1. In case of failure of a module 1, a warning can be sent associated with the last updated information (structure of models, parameter and indices of degradation). This enables to better understand any difference between the estimations and the reality and to adapt the models if necessary. The cases of failure can be stored in an historic database.

The invention is not limited to the method and the apparatus described here, which are only examples. The invention encompasses every alternative that a person skilled in the art would envisage when reading the present text.

The invention claimed is:

1. Computer implemented method for estimating degradation of a wire-bonded power semi-conductor module comprising:
    a) obtaining an indicator of degradation of said module at a first instant;
    b) estimating an estimated indicator of degradation of said module at a second instant by applying a temporal degradation model to said indicator of degradation at said first instant, wherein temperature is a parameter of said temporal degradation model to estimate said indicator of degradation of said module at a second instant as a function of said indicator of degradation at said first instant;
    c) obtaining a set of on-line measures, said set including at least one of an on-state measured voltage, an on-state measured current and an on-line measured temperature of said module and each being measured at said second instant within plus or minus 100 microseconds;
    then,
    d1) converting said set of on-line measures into a deducted indicator of degradation at said second instant by applying an electrical equivalence model, and
    e1) calculating a computed deviation between said estimated indicator of degradation and said deducted indicator of degradation; or
    d2) converting said estimated indicator of degradation at said second instant into a set of on-line estimation, said set including at least one of an on-state estimated voltage, an on-state estimated current and an on-line estimated temperature of said module and each being estimated for said second instant by applying an electrical equivalence model, and e2) calculating a computed deviation between said set of on-line measure and said set of on-line estimation; and f) correcting said estimated indicator of degradation at said second instant into a corrected estimated indicator of degradation at said second instant as a function of the computed deviation.

2. Method according to claim 1, wherein the series of steps a) to f) are repeatedly executed as iterative loops, the corrected estimated indicator of degradation obtained at the end of a previous series being used as the indicator of degradation at a first instant for the next series.

3. Method according to claim 2, wherein the degradation model includes a parameter, the value of said parameter being updated as a function of the deviation computed in the previous series.

4. Method according to claim 1, wherein at least a temperature value and a current value are monitored, and wherein step c) is triggered when the monitored values respect predetermined criteria.

5. Method according to claim 1, wherein the series of steps a) to f) are executed at least a first time during a monitoring phase, and then, at least one series of the following steps is executed, during a forecast phase:

a') obtaining an indicator of degradation of said module at a first instant;

b') estimating an estimated indicator of degradation of said module at a second instant by applying the temporal degradation model to said indicator of degradation at said first instant.

6. System comprising:
at least one wire-bonded power semi-conductor module,
a set of sensors coupled to the said at least one module to measure a set of on-line measures ($X_{on\_meas\_t}$), said set of on-line measures including at least one of an on-state measured voltage, an on-state measured current, and an on-line measured temperature of said at least one module, and
a processor operatively associated to a memory and arranged to received data issued from the measures of the set of sensors and configured to execute the method according to claim 1.

7. A computer-readable non-transient recording medium on which processor executable instructions are stored, which when executed by a processor cause the processor to implement a method according to claim 1.

* * * * *